United States Patent [19]
Ozaki

[11] Patent Number: 5,875,132
[45] Date of Patent: Feb. 23, 1999

[54] SEMICONDUCTOR MEMORY DEVICE FOR STORING DATA COMPRISING OF PLURAL BITS AND METHOD FOR OPERATING THE SAME

[75] Inventor: Hideyuki Ozaki, Hyogo-ken, Japan

[73] Assignee: Mitsubishi Denki Kabushiki Kaisha, Tokyo, Japan

[21] Appl. No.: 545,786

[22] Filed: Jun. 29, 1990

[30] Foreign Application Priority Data

Oct. 11, 1989 [JP] Japan ................................ 1-264149

[51] Int. Cl.[6] .................................................. G11C 16/04
[52] U.S. Cl. .............................. 365/189.03; 365/230.03; 365/227
[58] Field of Search ............................ 365/227, 189.03, 365/230.03

[56] References Cited

U.S. PATENT DOCUMENTS

| 4,404,663 | 9/1983 | Greene et al. . | |
|---|---|---|---|
| 4,502,131 | 2/1985 | Giebel | 371/21.3 |
| 4,744,058 | 5/1988 | Kawashima et al. | 365/200 |
| 4,839,860 | 6/1989 | Shinoda et al. | 365/230.03 |
| 4,873,669 | 10/1989 | Furutani et al. | 365/230.03 |
| 4,878,203 | 10/1989 | Arakawa | 365/230.03 |
| 4,881,203 | 11/1989 | Watanabe et al. | 365/230.03 |
| 4,891,795 | 1/1990 | Pinkham et al. | 365/230.03 |
| 4,894,770 | 1/1990 | Ward et al. | 365/230.23 |

FOREIGN PATENT DOCUMENTS

| 62-112292 | 5/1987 | Japan . |
| 62-188090 | 8/1987 | Japan . |

OTHER PUBLICATIONS

"E–Prom Doubles Bit Density Without Adding A Pin", Bob Greene, et al., Electronics/Aug. 16, 1979, pp. 126–129.

*Primary Examiner*—A. Zarabian
*Attorney, Agent, or Firm*—McDermott, Will & Emery

[57] ABSTRACT

A semiconductor memory device includes a plurality of input/output terminals (I/O1 to I/O4), a plurality of memory cell groups (1 to 4) and a plurality of sense amplifiers (31 to 34). A plurality of decision circuits (81 to 84) and a plurality of selection circuits (91 to 94) are provided in association with the input/output terminals (I/O1 to I/O4). A high voltage is applied to the input/output terminals that are not in use. This fixedly sets the corresponding sense amplifier groups to the non-activated state by means of the corresponding decision circuit and the selection circuit.

10 Claims, 7 Drawing Sheets

| STATE OF WE AT TIME T1 | H | L | L |
|---|---|---|---|
| STATE OF I/Oi AT TIME OF T1 | IRRELEVANT | H | L |
| SEi | H | H | L |

FIG.9 PRIOR ART ns for inputting or outputting data comprising plural bits, wherein the power consumption by functional circuit blocks corresponding to terminals not in sue may be eliminated.

It is yet another object of the present invention to provide a semiconductor memory device having a plurality of terminals for inputting or outputting data comprising plural bits, wherein only functional circuit blocks corresponding to terminals in use may be activated.

SEMICONDUCTOR MEMORY DEVICE FOR STORING DATA COMPRISING OF PLURAL BITS AND METHOD FOR OPERATING THE SAME

BACKGROUND OF THE INVENTION

1. Field of the Invention

This invention relates to a semiconductor memory device and, more particularly, to a semiconductor memory device having a plurality of terminals for inputting or outputting data comprising plural bits, and the method for operating the memory device.

2. Description of the Background Art

The semiconductor memory device of various word organizations are currently employed. For example, as for the 1M bit dynamic random access memory (referred to hereinafter as DRAM), there are presently two kinds of word organizations, namely 1M word×1 bit and 256K word×4 bit word organizations. The DRAM of the 1M word×1 bit word organization is employed in a system in need of a larger memory capacity, such as a large sized computer, whereas the DRAM of the 256K word×4 bit organization is employed in a system in need of a smaller memory capacity, such as a personal computer or a word processor.

Figure 9:
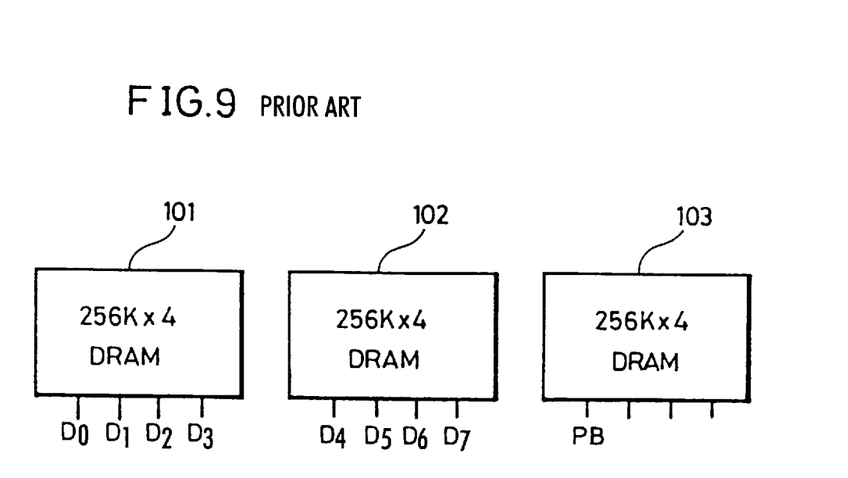
FIG. 9 is a diagrammatic view for illustrating certain inconveniences of the conventional DRAM.

In these memory systems, data with parity bits annexed thereto are frequently employed. For example, when one parity bit is annexed to the 1-byte or 8-bit data, each unit of the processed data is made up of 9 bits. In such case, with a system having a smaller memory capacity, such as personal computer or a word processor, three DRAMs each being of a 256K word×4 bit organization, are necessitated. In one DRAM 101 of the three DRAMs in FIG. 9, 4-bit data D0 to D3 of the 8-bit data are stored, whereas, in another DRAM 102 of the DRAMs, the remaining 4-bit data D4 to D7 are stored. In the remaining DRAM 103, a parity bit PB is stored. Thus the four data input/output terminals are employed in their entirety in two of the three DRAMs 101 to 103, whereas only one input/output terminal is used in the remaining DRAM.

In a DRAM provided with plural input/output terminals, plural source amplifiers are provided in association with the input/output terminals. A major portion of the power consumed in a DRAM is consumed at a sense amplifier charging and discharging the bit lines. With conventional DRAMs, the totality of the sense amplifiers are always in operation irrespective of the number of the input/output terminals employed. Thus there is not much difference in the power consumption of the DRAM, no matter whether only one input/output terminal is in use or all of the four input/output terminals are in use.

Recently, in keeping with reduction in size of the personal computers and word processors, or coming into popular use of the laptop type personal computer as a word processor, battery backup has become necessary. Consequently, there is a demand for reducing power consumption by the memory system to as small a value as possible, and hence a demand for eliminating wasteful power consumption.

SUMMARY OF THE INVENTION

It is an object of the present invention to provide a semiconductor memory device having a plurality of terminals for inputting or outputting data comprising plural bits, in which wasteful power consumption may be reduced.

It is another object of the present invention to provide a semiconductor memory device having a plurality of termi- The semiconductor memory device for storing data comprising plural bits according to the present invention is provided with a plurality of terminals for inputting or outputting data comprising plural bits, a plurality of functional circuit blocks provided in correspondence to the terminals and setting devices for fixedly setting one of the functional circuit blocks to the non-activated state.

With the semiconductor memory device of the present invention, the functional circuit blocks corresponding to the terminals not in use may be fixedly set by the setting devices to the non-activated state. Consequently, power is consumed only at the functional circuit blocks corresponding to the terminals that are in use, while power is not consumed at the functional circuit blocks corresponding to the terminals that are not in use.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

By referring to the drawing, a preferred illustrative embodiment of the present invention will be explained in detail.

Figure 1:
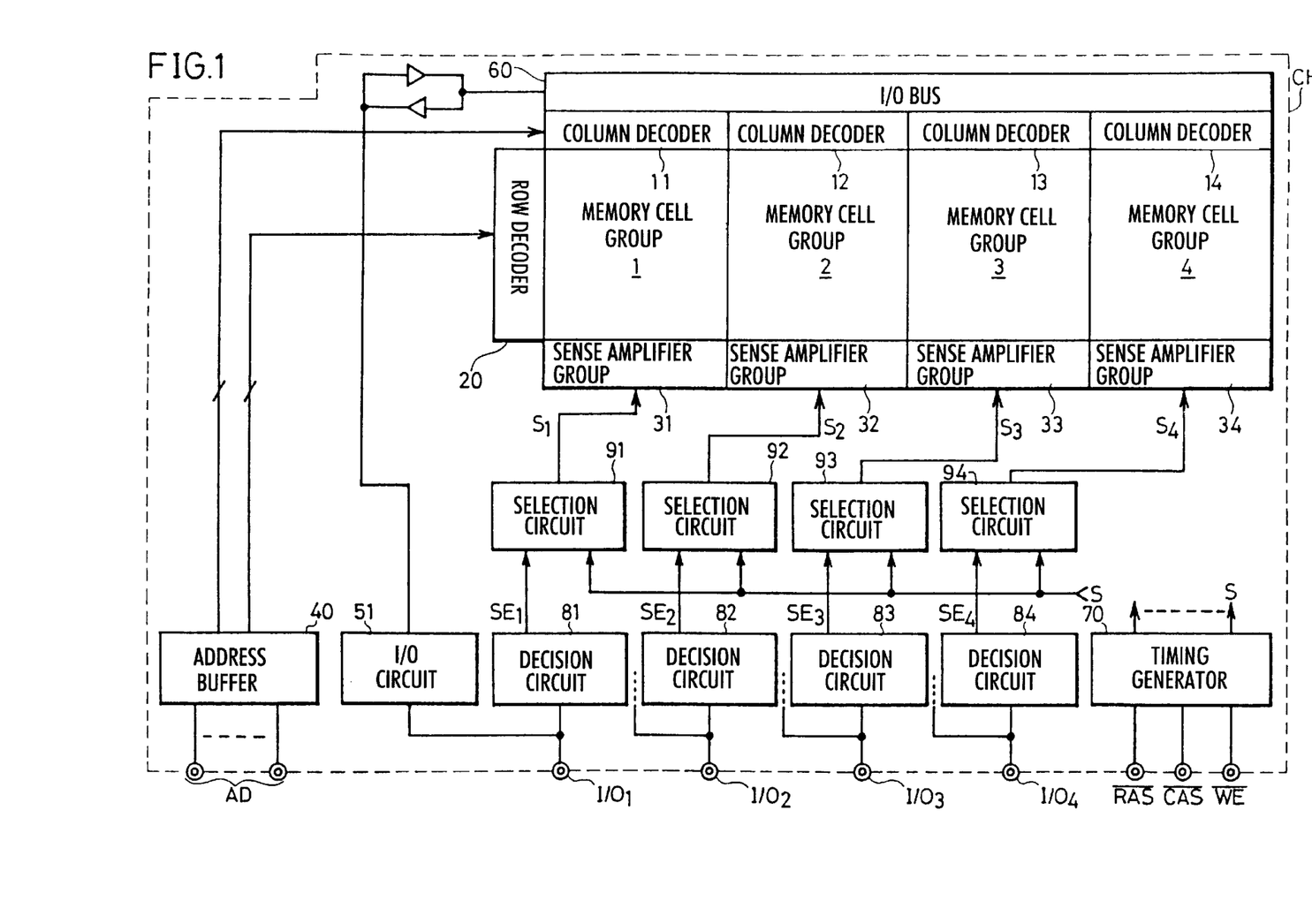
FIG. 1 is a block diagram showing the overall structure of the DRAM according to an embodiment of the present invention.

FIG. 1 is a block diagram showing a DRAM having a 256K word×4 bit organization according to an embodiment of the present invention.

On a semiconductor chip CH, there are provided four input/output terminals I/O1 to I/O4 for inputting and outputting 4-bit data. Four memory cell groups 1 to 4 are provided in correspondence with the four input/output terminals I/$\overline{O}$1 to I/$\overline{O}$4. Each of the memory cell groups 1 to 4 includes 256K bit memory cells in a matrix configuration.

Column decoders 11 to 14 are provided in correspondence to the memory cell groups. A row decoder 20 is provided in common to the memory cell groups 1 to 4. Sense amplifiers 31 to 34 are provided in correspondence to the memory cell groups 1 to 4.

On the semiconductor chip CH, there is provided an address buffer 40 for receiving address signals AD applied from outside (i.e., externally). The address buffer 40 applies the address signal AD applied from outside to the row decoder 20 as the row address signal. The address buffer 40 also applies the address signals AD applied from outside to the column decoders 11 to 14 at a predetermined timing as the column address signals.

The input/output terminal I/O1 is connected via an input/output circuit 51 to an I/O bus 60. Similarly, the input/output terminals I/O2 to I/O4 are separately connected via input/output circuits, not shown, to the I/O bus 60.

During data writing, the row decoder 20 is responsive to the row address a signal to select a row of memory cells in the memory cell groups 1 to 4. The column decoders 11 to 14 are similarly responsive to the column address signal to select columns of memory cells in the memory cell groups 1 to 4. In this manner, a memory cell is selected in each of the memory cell groups 1 to 4.

During data writing, the 4-bit data applied to the input/output terminals I/O1 to I/O4 are written in the four memory cells selected by means of the input/output circuits and the I/O bus 60. During data read-out, data stored in the selected four memory cells are amplified by the sense amplifiers 31 to 34 so as to be read out to the outside at I/O1 to I/O4 by way of the I/O bus 60 and the input/output circuits.

Meanwhile, a timing generator 70 is responsive to a row address strobe signal $\overline{RAS}$, a column address strobe signal $\overline{CAS}$ and a write enable signal $\overline{WE}$ to generate various control signals.

In the present illustrative embodiment, there are provided decision circuits 81 to 84 for giving a decision as to whether or not the input/output terminals are in use, and sense amplifier driving selection circuits 91 to 94, referred to hereinafter as selection circuits. These decision circuits 81 to 84 and the selection circuits 91 to 94 make up setting means for fixedly setting the sense amplifiers not in use in the unactivated state.

The decision circuits 81 to 84 usually apply selection signals SE1 to SE4 to the selection circuits 91 to 94. These selection circuits 91 to 94 apply sense amplifier driving signals Si generated at the timing generator 70, to the sense amplifiers 31 to 34 as sense amplifier driving signals S1 to S4, respectively, thereby activating the sense amplifiers 31 to 34.

On the other hand, when a high voltage is applied to, for example, the input/output terminal I/O4, the selection signal SE4 is not generated by the decision circuit 84. In this case, the sense amplifier driving signal S4 is not applied to the sense amplifiers 34 by the selection circuit 94, so that the sense amplifier 34 remains unactivated.

Figure 2:
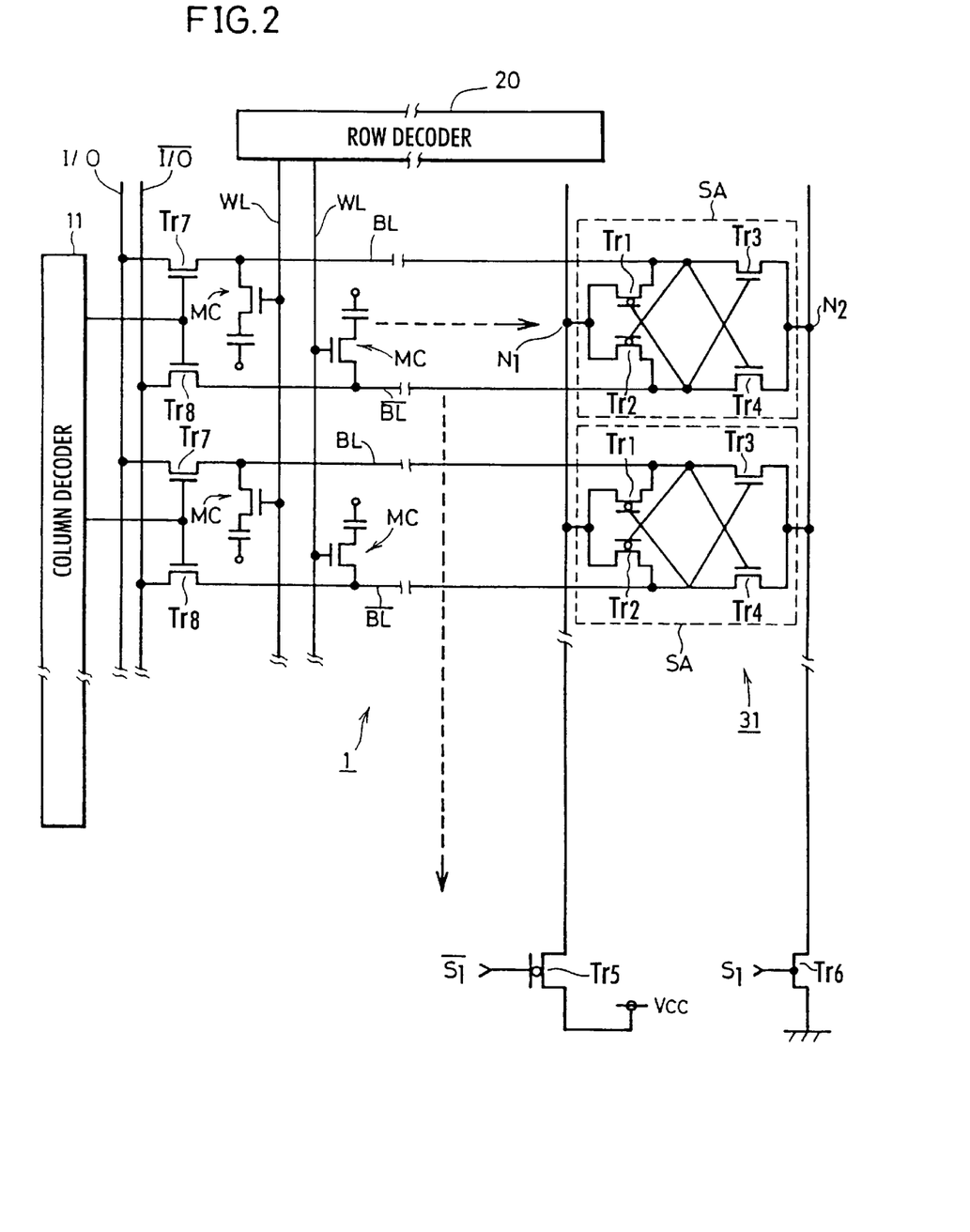
FIG. 2 is a circuit diagram showing the details of the main portion of the DRAM shown in FIG. 1.

FIG. 2 is a circuit diagram mainly showing the construction of the memory cell group 1 of FIG. 1 in more detail. It is noted that the construction of the memory cell groups 2 to 4 not shown is the same as that shown in FIG. 2.

In FIG. 2, a plurality of bit line pairs BL, $\overline{BL}$ and a plurality of word lines WL are arranged for intersecting one another, and memory cells MC are provided at the points of intersections of the bit line pairs and the word lines. The word lines WL are connected to the row decoder 20. The bit line pairs BL, $\overline{BL}$ are connected to input/output line pairs I/O, $\overline{I/O}$ via n-channel transistors Tr7, Tr8. To the gates of the transistors Tr7, Tr8 are applied decode signals from the column decoder 11.

A sense amplifier SA is provided each bit line pair BL, $\overline{BL}$. Each sense amplifier SA includes a p-channel sense amplifier consisting of p-channel transistors Tr1, Tr2, and an n-channel sense amplifier consisting of n-channel transistors Tr3, Tr4. The sense amplifier SA has a node N1 coupled to a source voltage Vcc via a p-channel transistor Tr5. The sense amplifier SA has a node N2 coupled to a ground potential via an n-channel transistor Tr6. A sense amplifier driving signal S1 is applied to the gate of the transistor Tr6. A sense amplifier driving signal $\overline{S1}$, which is an inversion of the sense amplifier driving signal S1, is applied to the gate of the transistor Tr5. The sense amplifiers SA in the sense amplifier group 31 are simultaneously activated by the sense amplifier driving signals S1, $\overline{S1}$.

Figure 3:
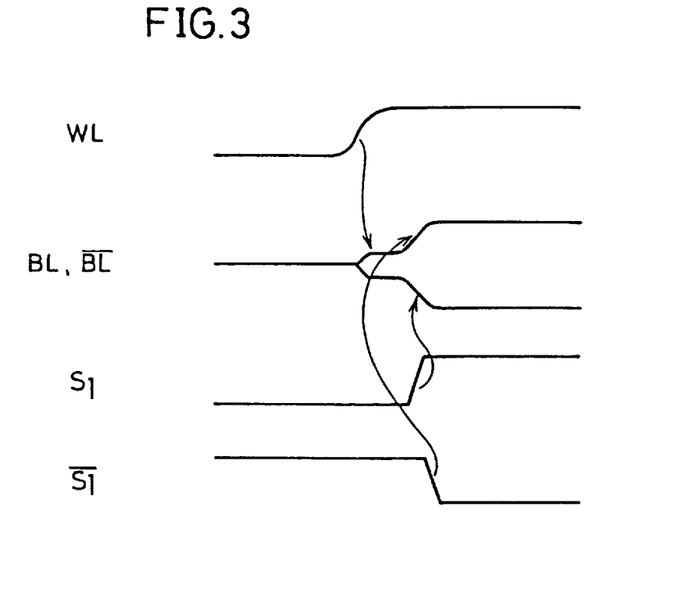
FIG. 3 is a waveform diagram for illustrating the operation of the circuit shown in FIG. 2.

The operation of the circuit of FIG. 2 is explained by referring to the waveform diagram of FIG. 3. During data read-out, one of the word lines WL is selected by the row decoder 20 so that the potential of the selected word line is raised to the "H" level. Thus the data stored in the memory cells MC connected to the selected word lines WL are read out on the corresponding bit lines. As a result, a slight potential difference is produced in the bit line pairs BL, $\overline{BL}$. When the sense amplifier driving signal S1 rises to a "H" level, and the sense amplifier driving signal $\overline{S1}$ falls to an "L" level, the sense amplifiers SA are activated. As a result, the higher one of the potentials at the bit lines BL or $\overline{BL}$ is raised to the source potential Vcc while the lower potential is lowered to the ground potential. Power consumption occurs during such activation of the sense amplifiers SA.

Figure 4:
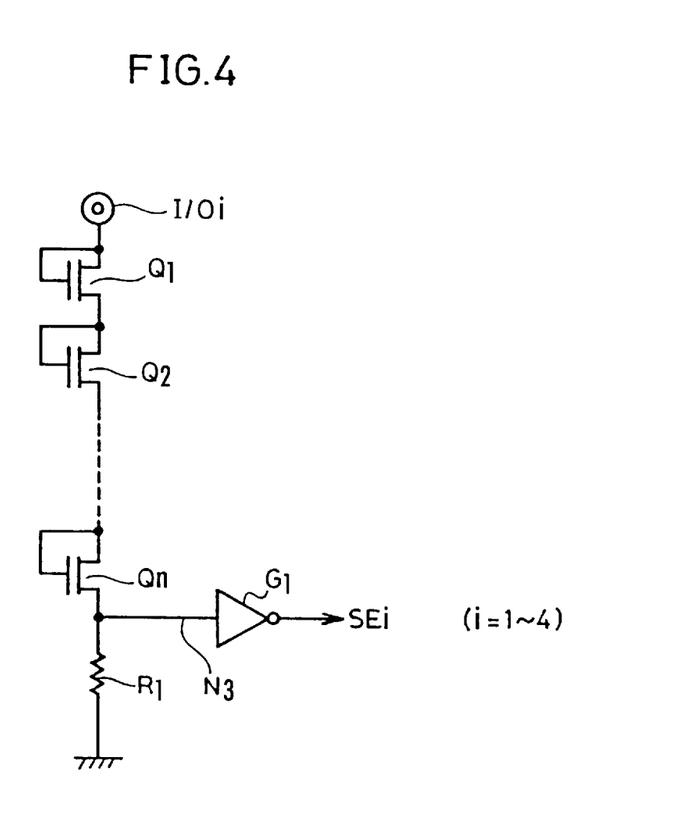
FIG. 4 is a circuit diagram showing the construction of a decision circuit in the DRAM shown in FIG. 1.
Figure 5:
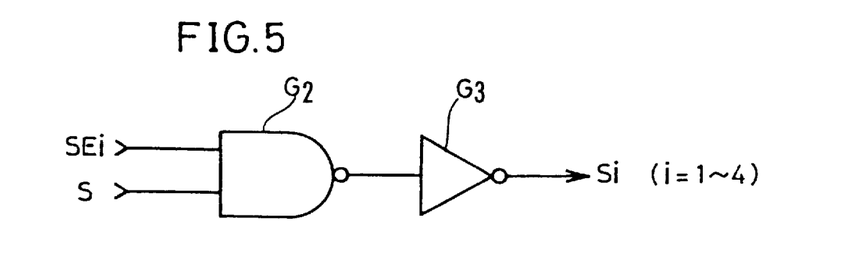
FIG. 5 is a logical circuit diagram showing the construction of a sense amplifier driving selection circuit in the DRAM shows in FIG. 1.

A typical example of the decision circuits 81 to 84 is shown in FIG. 4 and a typical example of the selection circuits 91 to 94 is shown in FIG. 5. In FIGS. 4 and 5, i indicates one of the numbers 1 to 4.

Referring to FIGS. 1 to 4, a series connection of n stages of n-channel transistors Q1 to Qn and a resistor R1 is connected between an input/output terminal and a ground terminal. An inverter G1 is connected at a junction between the transistor Qn and the resistor R1. The output of the inverter G1 is applied to a corresponding circuit as the selection signal SE1.

The number n of the stages of the n-channel transistors is set so that the voltage at a node N3 is at the "L" level when the voltage in a predetermined range, usually in the range of from 0 to source voltage Vcc, is applied to the input/output terminal I/O1. Thus, when the voltage of the predetermined range is applied to the input/output terminal I/Oi, the selection signal SEi goes to a "H" level. On the other hand, when a voltage higher than the source voltage Vcc is applied to the input/output terminal I/Oi, the potential at the node N3 goes to a "H" level, so that the selection signal SEi is at the "L" level.

The selection circuit of FIG. 5 includes a NAND gate G2 and an inverter G3. The NAND gate G2 has its one input terminal fed with the selection signal SEi and its other input terminal fed with the same sense amplifier driving signal Si as is output from the inverter G3. When the selection signal SEi is at the "H" level, the sense amplifier signal is output as the sense amplifier driving signal Si. When the selection signal SEi is at the "L" level, the sense amplifier driving signal Si goes to the "L" level. This inactivates the corresponding sense amplifier of the sense amplifier group.

Referring to FIG. 1, the operation of using only the input/output terminal I/O1, for example, is explained.

To the input/output terminal I/O1 is applied a voltage in a predetermined range, that is in the range of from zero to the source voltage Vcc. The input/output terminals I/O2 to I/O4 that are not in use are biased to a higher voltage in excess of the source voltage Vcc. A predetermined high voltage generating circuit is employed for applying a high voltage to the input/output terminals I/O2 to I/O4. Since virtually no current flows through the high voltage generating circuit, virtually no current electric power is consumed by the application of the higher voltage.

At this time, the selection signal SE1 goes to a "H" level, the selection signals SE2 to SE4 going to the "L" level. When the sense amplifier driving signal S is applied at a predetermined timing from a timing generator 70, only the sense amplifier driving signal S1 is activated, the sense amplifier driving signals S2 to S4 remaining unactivated. Hence, only the sense amplifier group 31 is in operation the sense amplifier groups 32 to 34 not being in operation. As a result, the power consumption in the DRAM of the present illustrative embodiment is reduced to about one fourth the power consumption with the conventional DRAM.

Figure 6:
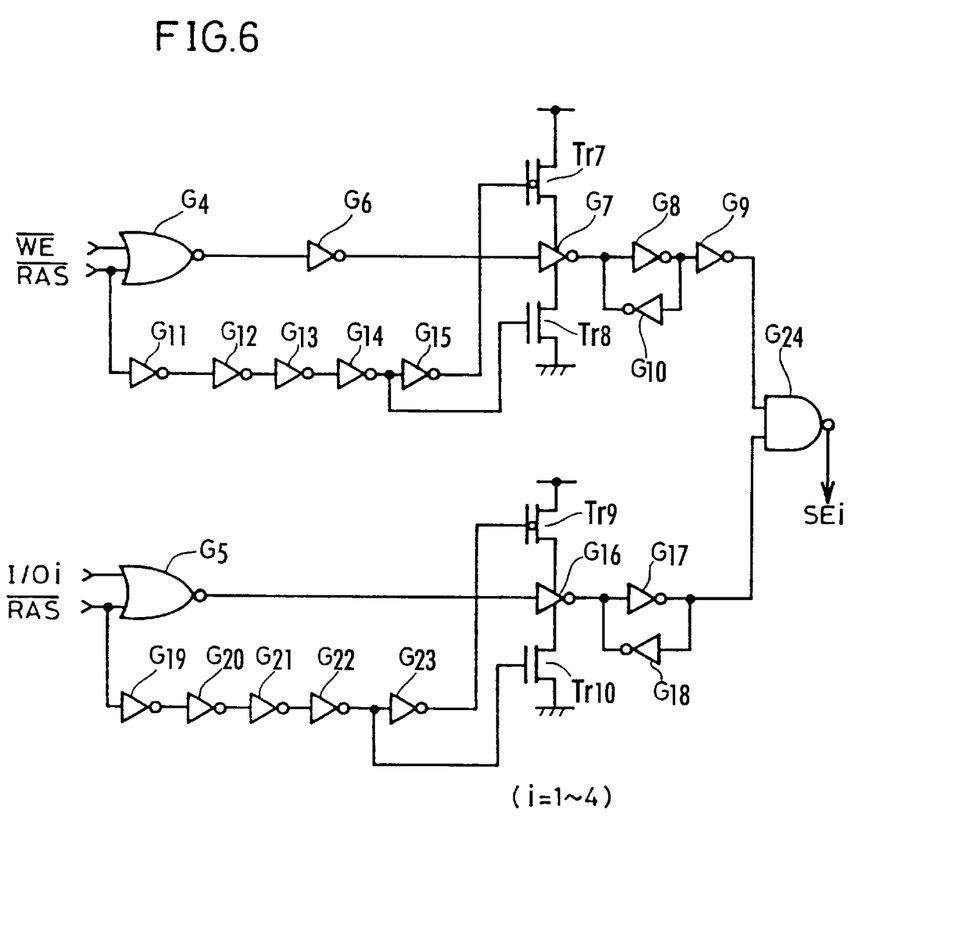
FIG. 6 is a logical circuit diagram showing another example of decision in the DRAM shown in FIG. 1.

FIG. 6 is a circuit diagram showing another embodiment of a decision circuit.

The decision circuit of FIG. 6 includes NOR gates G4 and G5, inverters G6 to G23, a NAND gate G24, p-channel transistors Tr7 and Tr9, and n-channel transistors Tr8 and Tr10. This decision circuit generates a low level selection signal SEi when the row address strobe signal $\overline{RAS}$ applied from outside, the write enable signal $\overline{WE}$ and a signal applied to the input/output signal I/Oi are at a predetermined logical level, while generating a high level selection signal SEi otherwise.

Figure 7:
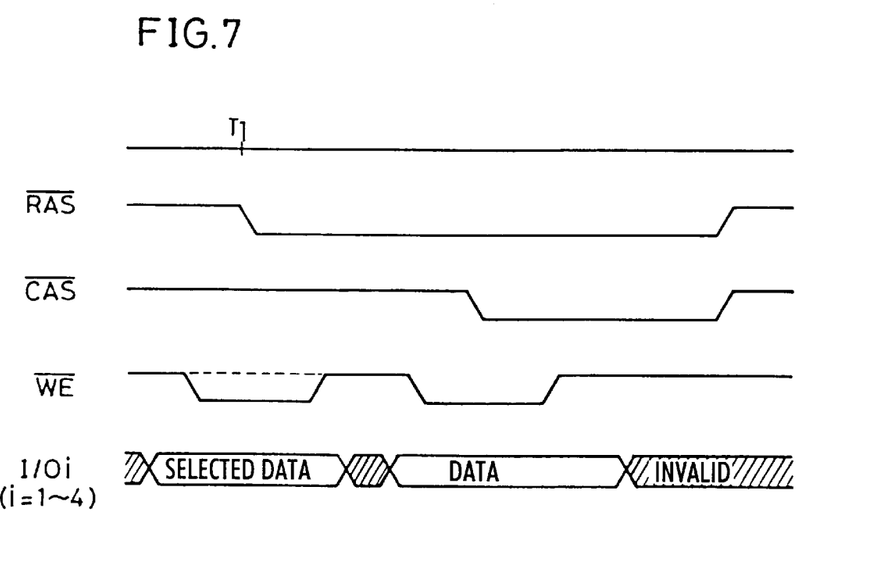
FIG. 7 is a timing chart for illustrating the operation of the decision circuit shown in FIG. 6.
Figure 8:
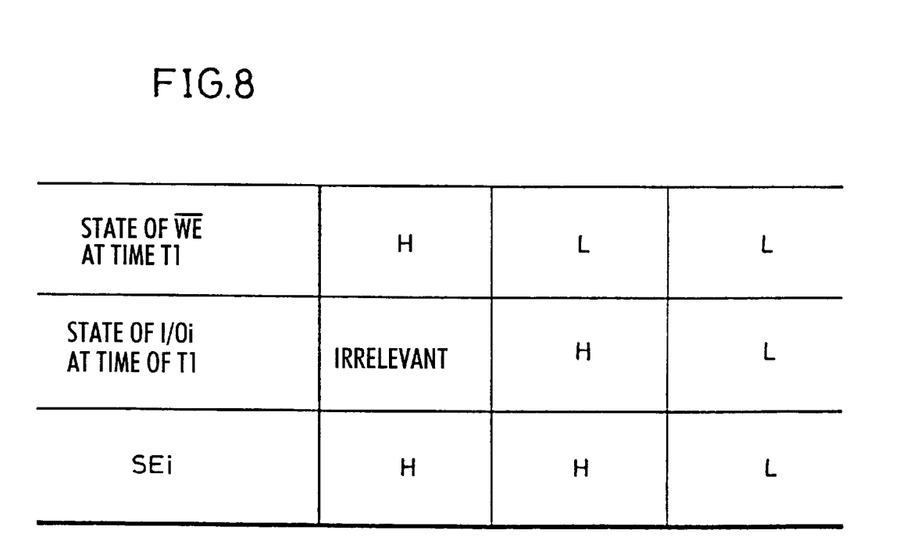
FIG. 8 is a logical circuit diagram for illustrating the operation of the decision circuit shown in FIG. 6.

Then, by referring to the timing chart of FIG. 7, and the logical diagram of FIG. 8, the operation of the decision circuit of FIG. 6 is explained.

When the write enable signal $\overline{WE}$ is at a high level at the time T1 when the row address strobe signal $\overline{RAS}$ falls, the selection signal SEi is at the high level, irrespective of the status of the input/output terminal I/Oi. Hence, when the "H" level sense amplifier driving signal S is applied the sense amplifier driving signal Si, i being a number of from 1 to 4, goes to the "H" level. In this manner, the sense amplifiers of the corresponding sense amplifier group come into operation.

The selection signal SEi similarly goes to the "H" level when the write enable signal $\overline{WE}$ is at the "L" level at time T1, and the "H" level signal is applied to the input/output terminal I/Oi. Hence, responsive to the sense amplifier driving signal S, the sense amplifiers of the corresponding sense amplifier group come into operation.

When the write enable signal $\overline{WE}$ is at the "L" level at time T1, and the "L" level signal is applied to the input/output terminal I/Oi, the selection signal SEi is at the "L" level. This sets the sense amplifier driving signal Si to the "L" level. Thus the sense amplifiers of the corresponding sense amplifier group are not in operation.

Thus it becomes possible to select the sense amplifier group to be driven in dependence upon the status of the write enable signal $\overline{WE}$ and the signal applied to the input/output terminal I/Oi at the falling time of the row address strobe signal $\overline{RAS}$.

The structure of the decision circuits 81 to 84 and the selection circuits 91 to 94 are not limited to that shown in FIGS. 4 to 6, but any other structure may be employed, in so far as the sense amplifier groups corresponding to the input/output terminals not in use can be set fixedly to the non-activated state.

In the above illustrative embodiment, the functional circuit blocks corresponding to the input/output terminals are the sense amplifier groups. However, the functional circuit blocks corresponding to the input/output terminals are not necessarily the sense amplifier groups. For example, the construction in which the decoders, input/output circuits or the like corresponding to the input/output terminals may be independently set to the non-activated state with the favorable effect similar to that described above.

From the foregoing it is seen that the present invention provides an arrangement in which the functional circuit blocks corresponding to plural terminals can be independently set to the non-activated state, so that only the functional circuit blocks corresponding to the terminals that are in use can be activated, resulting in elimination of wasteful power consumption.

Although the present invention has been described and illustrated in detail, it is clearly understood that the same is by way of illustration and example only and is not to be taken by way of limitation, the spirit and scope of the present invention being limited only by the terms of the appended claims.

Abstract of the Prepublication (1) Japanese Patent Laying-Open No. 62-20197.

A refresh control circuit includes a refresh signal generator 50 for generating a refresh mode signal, a refresh address counter circuit 52 for furnishing an address signal at the time of the refresh operation, and a memory cell block switching circuit 51 for rendering the number of the sense amplifiers operating at the time of the refreshing different from that of the sense amplifiers operating during usual reading. An M number of the sense amplifiers are in operation during usual reading, while a M×L number of the sense amplifiers are in operation during refreshing. This allows the power consumption during the usual reading to be reduced without changing the number of the refresh cycles.

(2) Japanese Patent Laying-Open No. 62-241198.

A number of sense amplifiers larger than the number of sense amplifiers larger than the number of sense amplifiers in operation during memory accessing are in operation during refreshing.

(3) Japanese Patent Laying-Open No. 62-291792.

Sense amplifiers within all of the memory cell blocks are in operation during refreshing by dedicated refresh signals, while only sense amplifiers within the memory cell block inclusive of the selected memory cell are in operation during the read-out/write operation other than refreshing.

(4) Japanese Patent Laying-Open No. 63-2197.

Memory cells are divided into plural blocks. During each active cycle, only a part of plural blocks are in operation selectively. A sense amplifier is arranged between adjacent ones of a plurality of blocks which are related to each other so that, when one of the blocks is in operation, the other block is not in operation. Switching means is provided for connecting or disconnecting the sense amplifier with one or the other block.

(5) Japanese Patent Laying-Open No. 63-87695.

A memory cell array is divided into a plurality of sub-arrays. A Y decoder associated with each sub-array is provided independently for each sub-array. Only the Y decoder associated with the sub-array to which belongs a predetermined memory cell is activated, while the Y decoders associated with the remaining sub-arrays are not activated.

Comment

The present invention is directed to a semiconductor memory device having a plurality of terminals for inputting or outputting data comprising plural bits. The feature of the present invention resides in that the functional circuit blocks connected to terminals not in use are fixedly set to the non-activated state. This eliminates power consumption by the functional circuit blocks corresponding to the terminal that are not in use. The above prepublications (1) to (5) are destitute of the above described construction of the present invention.

What is claimed is:

1. A semiconductor memory device for storing data comprising plural bits comprising:

a plurality of terminals (I/O1 to I/O4) for respectively inputting or outputting said data comprising plural bits to corresponding respective groups of memory cells, a plurality of circuit means (31 to 34) for manipulating data, said circuit means provided in respective correspondence to said plural terminals (I/O1 to I/O4) and said groups of memory cells, and setting means (81 to 84; 91 to 94) for fixedly setting one of said plurality of circuit means (31 to 34) corresponding to one of said plurality of terminals to an inactive state while at least another one of said plurality of circuit means corresponding to another of said plurality of terminals remains in an active state, wherein said setting means is responsive to application of a deactivating signal to said one of said terminals by setting the circuit means respectively corresponding thereto to an inactive state, wherein said deactivating signal comprises a high voltage applied by a high voltage generating circuit, said high voltage being higher than a predetermined range of an operating voltage.

2. A semiconductor memory device according to claim 1 further comprising a plurality of memory cell groups (1 to 4) provided in correspondence to said plurality of terminals (I/O1 to I/O4) and each including a plurality of memory cells;

said circuit means including a plurality of sense amplifiers (31 to 34) for sensing and amplifying data read out from said memory cell groups (1 to 4).

3. A semiconductor memory device according to claim 1 further comprising a plurality of memory cell groups (1 to 4) provided in correspondence to said terminals (I/O1 to I/O4) and each including a plurality of memory cells, said circuit means including a plurality of selection means (11 to 14) provided in correspondence to said terminals (I/O1 to I/O4) and each selecting one of the memory cells in the associated memory cell group.

4. A semiconductor memory device according to claim 1 further comprising a plurality of memory cell groups (1 to 4) provided in correspondence to said terminals (I/O1 to I/O4) and each including a plurality of memory cells, said circuit means including a plurality of input/output means (51) for applying data from outside to the associated memory cell groups or outputting data read out from the associated memory cell groups to outside.

5. A semiconductor memory device according to claim 1 further comprising timing generating means (70) responsive to an externally applied control signal to produce a driving signal to activate said circuit means (31 to 34);

said setting means including a plurality of nondestructive decision means (81 to 84) provided in respective correspondence to said terminals (I/O1 to I/O4) each generating a respective nondestructive selection signal when said deactivating signal is applied to the respectively corresponding one of said terminals, and a plurality of nondestructive selection means (91 to 94) provided in respective correspondence to said decision means (81 to 84) for preventing said driving signal from being applied to the respective circuit means corresponding thereto when the respective selection signal is generated by the corresponding decision means.

6. A semiconductor memory device according to claim 1, further comprising timing generating means (70) responsive to a plurality of externally applied control signals by producing a driving signal to control the operation of said semiconductor memory device, said setting means (81 to 84; 91 to 94) setting the associated circuit means for manipulating data to the inactive state when the timing of said external control signals is in a predetermined state and when a predetermined signal is applied to one of said terminals (I/O1 to I/O4).

7. A semiconductor memory device according to claim 6 wherein said setting means include a plurality of nondestructive decision means (81 to 84) provided in respective correspondence to said terminals (I/O1 to I/O4) each generating a respective nondestructive selection signal when the timing of said external control signals is in a predetermined state and when said predetermined signal is applied to a corresponding one of the terminals; and a plurality of nondestructive selection means (91 to 94) provided in respective correspondence to said decision means (81 to 84) for preventing said driving signal from being applied to the respective circuit means corresponding thereto when a respective selection signal is generated by a corresponding one of said decision means.

8. A method for operating a semiconductor random access memory device including a plurality of terminals for inputting or outputting plural bit data to or from a plurality of groups of memory cells in respective correspondence to said plurality of terminals and a plurality of circuit means for manipulating data for storage in or output from said groups of memory cells, said plurality of circuit means provided in respective correspondence to said terminals, said method comprising the steps of:

applying a deactivating signal, comprising a voltage level included in an operating signal having an operating voltage level within a predetermined operating range, to one of said terminals by generating a voltage outside said predetermined operating range and including said voltage in said operating signal, and responsive to application of said deactivating signal to said one of said terminals, setting only a respectively corresponding one of the circuit means to an inactive state, and maintaining another one of said circuit means corresponding to another one of said terminals, to which a deactivating signal is not applied, in an active state.

9. A semiconductor memory device for storing plural bit data having a plurality of bits, comprising:

a plurality of terminals (I/O1 to I/O4) for respectively inputting or outputting said plural bit data to a respectively corresponding plurality of groups of memory cells, a plurality of circuit means (31 to 34) for manipulating data provided to said terminals, said plurality of circuit means provided in respective correspondence to said plurality of terminals, and setting means (81 to 84; 91 to 94) for fixedly setting a selected one of said plurality of circuit means respectively corresponding to a selected one of said terminals to an inactive state while at least another one of said plurality of circuit means respectively corresponding to another of said terminals is in an active state, said setting means being responsive to application to said one of said terminals of a signal having a voltage outside a predetermined operating voltage range by setting to the inactive state said selected one circuit means respectively corresponding to said one of said terminals.

10. A semiconductor memory device as recited in claim 9 further comprising means for generating a voltage higher than said predetermined voltage range in said signal.

* * * * *